(12) United States Patent
Tarakji

(10) Patent No.: US 10,559,693 B2
(45) Date of Patent: Feb. 11, 2020

(54) AREA-EFFICIENT SINGLE-LEGGED SOI MOSFET STRUCTURE IMMUNE TO SINGLE-EVENT-EFFECTS AND BIPOLAR LATCH-UP

(71) Applicant: Ahmad Houssam Tarakji, Sacramento, CA (US)

(72) Inventor: Ahmad Houssam Tarakji, Sacramento, CA (US)

(*) Notice: Subject to any disclaimer, the term of this patent is extended or adjusted under 35 U.S.C. 154(b) by 327 days.

(21) Appl. No.: 15/732,138

(22) Filed: Sep. 25, 2017

(65) Prior Publication Data

US 2019/0097062 A1 Mar. 28, 2019

(51) Int. Cl.
*H01L 29/786* (2006.01)
*H01L 27/12* (2006.01)
*H01L 29/45* (2006.01)
*H01L 29/06* (2006.01)

(52) U.S. Cl.
CPC .... *H01L 29/78618* (2013.01); *H01L 27/1203* (2013.01); *H01L 29/0607* (2013.01); *H01L 29/458* (2013.01); *H01L 29/78612* (2013.01); *H01L 29/78624* (2013.01)

(58) Field of Classification Search
CPC ............... H01L 21/84; H01L 29/78612; H01L 29/78615; H01L 21/28618; H01L 29/1079; H01L 29/1087; H01L 29/0847; H01L 27/1203; H01L 21/2257; H10L 21/28052
See application file for complete search history.

(56) References Cited

U.S. PATENT DOCUMENTS 5,185,280 A  2/1993 Houston et al.
9,741,857 B2  8/2017 Tarakji

OTHER PUBLICATIONS

Troels Emil Kolding, "Consistent Layout Techniques for Successful RF CMOS Design", RF Integrated Systems and Circuits (RISC) Group, Aalborg University, Denmark.
C. Fenouillet Beranger et al., "Parasitic bipolar impact in 32nm undoped channel UTBOX and biased Grnd Plane FDSOI high-k/ metal gate tech.", Solid-State Elec. vol. 74, 2012.
Kwangseok Han et al., "RF Characteristics of 0.18-μm CMOS Transistors", Journ. Korea. Phys. Soc. vol. 40, No. 1, pp. 45-48, Jan. 2002.
P. E. Dodd et al., "Single-Event-Upset and Snapback in Silicon-on-Insulator Devices", Sndia National Laboratories, Albuquerque, New Mexico, Mar. 2000.

(Continued)

*Primary Examiner* — Matthew L Reames
*Assistant Examiner* — John A Bodnar

(57) ABSTRACT

New device structure for single-legged Silicon-On-Insulator Metal-Oxide-Semiconductor (SOI MOS) transistor is presented. This new structure imposes a hard barrier for an Impact-Ionizations current and for transients due to Single-Event-Effects (SEE's) in Body to laterally conduct (or diffuse) to the Source through the Body/Source junction. It forces these currents to conduct instead to the Source through an alternate path made of highly conductive Silicide. This alternate path effectively suppresses the latch-up of the built-in parasitic Bipolar structure without necessitating the incorporation of Body-Tied-Source (BTS) into the device layout which is known to increase the device periphery without correspondingly scaling its device current.

5 Claims, 3 Drawing Sheets

(56) References Cited

OTHER PUBLICATIONS

K.Hirose et al., "Analysis of Body-Tie Effects on SEU Resistance of Advanced FD-SOI SRAMs Through Mixed-Mode 3-D Simulations", IEEE Trans. Nuc. Sc., vol. 51, No. 6, Dec. 2004.
Takashi Shiozawa, "improvement of Thermal Stability of Ni Silicide on Heavily Doped N+_Si", Iwai Laboratory, Dept. of Elec. and Phys., pp. 41-59, 2007.

AREA-EFFICIENT SINGLE-LEGGED SOI MOSFET STRUCTURE IMMUNE TO SINGLE-EVENT-EFFECTS AND BIPOLAR LATCH-UP

BACKGROUND OF THE INVENTION

There are two primary approaches to the design of large-periphery Metal-Oxide-Semiconductor (MOS) Transistors; one relies on cascading (or arraying) column of multi-Legs (or multi-Fingers) Gates in parallel to enable delivering the required high output current. The other utilizes one single-legged device having sufficiently large Gate width that enables it to deliver same or similar amount of output current. Major advantage of the former approach is that it ensures a desired "Square-like" footprint for any particular large-periphery Transistor Layout. This provides more ease and flexibility in designing and laying-out such Large-periphery Transistors in any given Integrated-Circuit (IC). It also reduces the total device Gate Resistance, and hence it can boost the device power-gain and Bandwidth. The drawback can come however from an excessive increase of the Capacitive parasitic's with the increase of number of Legs (due to the increase of Gate-to-Drain and Gate-to-Source overpasses, and the Gate-to-Bulk parasitic's). This can still impose constraining limit on the device operations at relatively higher frequencies (GHz range) when the number of Legs becomes sufficiently high. Such hit on the Transistor Bandwidth from the multi-Legs Gate designs was described and demonstrated in the work of Kwangseok Han, Jeong-hu Han, Minkyu Je and Hyungcheol Shin, "*RF Characteristics of: 0.18-μm CMOS Transistors*", Journal of the Korean Physical Society, vol. 40, no. 1, pp. 45-48, January 2002. It arises simply because the resulting increase of the Capacitive parasitic's in the large-periphery multi-Legs MOS Transistor can outweigh its enhancement to Bandwidth that comes from the reduction of its Gate Resistance. A compromise is often sought in laying such very large-periphery devices that are specifically aimed to deliver high output currents. It optimizes the width of the Gate-Legs in a Multi-Legs MOS device such that it best balances the effects from its total capacitive parasitic's to those of its total equivalent Gate resistance. This technique for Layout optimization was described in the work of: Troels Emil Kolding., "*Consistent Layout Techniques for Successful RF CMOS Design*", RF Integrated Systems and Circuits (RISC) Group, Aalborg University, Denmark.

Despite their higher switching-speed (Bandwidth) from the effective suppressions of Junction-Capacitances, the Large-periphery multi-Legs Transistors that are based on Silicon-On-Insulator (SOI) technology can carry more Bandwidth sensitivity with increasing Gate-to-Drain and Gate-to-Source overpasses and higher Gate-to-Bulk parasitic's. While the Junction-Capacitances in the Bulk MOS Transistors scale with the increase of total number of Gate-Legs and can therefore buffer the effects from the corresponding increase of the overpass-Capacitances, these Junction-Capacitances are suppressed in the SOI-MOS and consequently the switching-speed in these devices reduces more pronouncedly with the increase of total number of Gate-Legs. This consequently causes these multi-Legs SOI-MOS devices to naturally favor for higher performance the Layouts that incorporate MOS structures with wider Gate-Legs and reduced number of Legs. Furthermore the total equivalent Gate resistance in these SOI-MOS devices reduces substantially even with just a few wide Gate-Legs, or only a one wider Gate-Leg, when the Metal-Gates replace PolySilicon-Gates.

A whole major issue does arise however with SOI-MOS Transistor designs that incorporate wider Gate-Legs. It is their higher susceptibility to Bipolar latch-up because of their substantially higher Impact-Ionizations currents that are generated around their Drains (the Impact-Ionizations current per Leg scales with widening the Gate-Leg). This is especially true for the case of Fully-Depleted-SOI (FD-SOI) MOS Transistor that inherently possesses an already lowered Body-to-Source barrier through which the Impact-Ionizations current conducts and lowers it further to cause this latch-up. This tendency for latch-up in FD-SOI MOS was first reported in the work of C. Fenouillet-Beranger et al., "Parasitic bipolar impact in 32 nm undoped channel Ultra-Thin BOX (UTBOX) and biased Ground Plane FDSOI high-k/metal gate technology", Solid-State Electronics, vol. 74, pp. 32-37, 2012.

Such effects from the parasitic Bipolar are especially damaging in the integrated Electronics that operate in high radiation environments (high aviation altitudes, outer Space, etc. . . . ). When these Transistors are biased at their maximum nominal magnitudes for highest performance, energetic cosmic-rays that can strike even their ultra-thinned Sensitive Silicon Volumes (e. g case of ultra-thin FD-SOI MOS Transistors) can induce a much added charge that can cause substantial further lowering of their Body-to-Source lateral barriers therefore resulting in many different functional failures or malfunctions (e. g. Single-Event-Burnout, Single-Event-Latch, Single-Event-Upset, Single-Event-Transient, Single-Bit-Upset, Multiple-Bit-Upset, Single-Event-Functional-Interrupt); all these modes of failures or malfunctions are commonly referred to as: Single-Event-Effects (SEE's). It was specifically demonstrated by P. E. Dodd et al., "Single-Event-Upset and Snapback in Silicon-on-Insulator Devices", Sandia National Laboratories, Albuquerque, N. Mex., March 2000, that a combined effect from Impact-Ionizations due to high biasing and from Single-Event-Effects due to the Cosmic rays does drastically amplify these failures (by factor close to 6.5). While the other effects from Cosmic rays that still damage the Electronics, such as Total-Ionization-Dose (TID), typically take quite long time (months or even years) to build their damage on the MOS dielectrics and slowly and gradually drift the device performance, the SEE's on the other hand do and can cause an instantaneous and swift failure when they are not very adequately guarded against. Most recent major incident caused by SEE's is the 2008 Cosmic-ray showers on the commercial passenger airline QF72 that prevented it from accurately processing its Angle-of-Attack data. One crew member and eleven passengers suffered serious injuries, while eight crew members and ninety-five passengers suffered minor injuries.

A very adequate Device-level protection against the SEE's can reduce or may even totally eliminate the need for the Redundant-circuitries that are always employed nowadays in all the avionics and the Space electronic systems to tackle the SEE's. This can substantially reduce the die area of integrated-circuits and sensors as well as their power consumptions. It can also enable their more practical deployment everywhere and anywhere (e. g. in more tiny spaces and closer to other integrated modules). It can also pave the way for denser system-level integrations that may include much added on-chip functionalities.

The classical fix to this Bipolar latch-up has traditionally been through incorporating a Body-Tied-Source (BTS)

implant within the Source-diffusion. This BTS is very highly doped and with same dopant type as the device Body. This allows it to filter the Impact-Ionizations current away from the lateral Body-to-Source barrier and hence preventing the bipolar latch-up. This approach was well explained in the work of K. Hirose et al., "*Analysis of Body-Tie Effects on SEU Resistance of Advanced FD-SOI SRAMs Through Mixed-Mode 3D Simulations*", IEEE Trans. Nucl. Sc., vol. 51, no. 6, pp. 3349-3353, December 2004.

Two main issues still exist with this approach:
1—The low electric conductivity of the Body (especially in FD-SOI) that the Impact-Ionizations current sees to BTS can still cause Bipolar latch. This is because a high voltage-drop develops in this Body from the conducting Impact-ionizations current that sees this low electric conductance in Body. This had only recently been addressed through U.S. Pat. No. 9,741,857 B2 (Aug. 22, 2017).
2—The "effective" peripheral width of the Transistor (and therefore its drive current) gets reduced relative to the total footprint of the device layout. This is because the addition of this BTS region consumes from the Source-diffusion volume and reduces it. A set of design-rules that alleviate for given bias and device periphery this reduction from the total "effective" width of the Transistor were formulated and defined already through same Patent: U.S. Pat. No. 9,741,857 B2.

However no absolute closed-form (or complete) fix to the above still exists to date.

BRIEF SUMMARY OF THE INVENTION

The invention that is claimed provides a new SOI MOS device architecture that further alleviates the effects from this Bipolar latch-up and with a fully area-efficient design that does not reduce the "effective" total peripheral Width of the SOI-MOS. Its structure is based on trapping the Impact-Ionizations current in a band-engineered highly doped Pocket that junctions the Source while it interfaces the device Body on its one side along the entire Gate width of the device structure (in similarity to the device design of U.S. Pat. No. 9,741,857 B2). This Pocket has same dopant type as in device Body. It traps and diverts the Impact-Ionizations current directly to the Source (instead of diverting it to BTS as in the MOS device structures of U.S. Pat. No. 9,741,857B2). This diversion occurs through a well-engineered Silicide formation (back-Silicide) that solders this Pocket directly to the Source through the back-side of the Front-Silicon film of the Transistor that interfaces the buried dielectric (either a Buried-Oxide (BOX), or Sapphire, or any other insulator). This design can still effectively diverts the Impact-Ionizations current away from the lateral Body-to-Source Junction and does not necessitate use of BTS that consumes volume from the Source and reduces the device current for any given total device periphery. It can be valid for the FD-SOI MOS as well as for the Partially-Depleted-SOI MOS (PD-SOI-MOS). Trenched or rectangular metals (e. g. Tungsten) can also contact this back-Silicide that wires the highly doped Pocket to Source.

DETAILED DESCRIPTION OF THE INVENTION

Figure 1A:
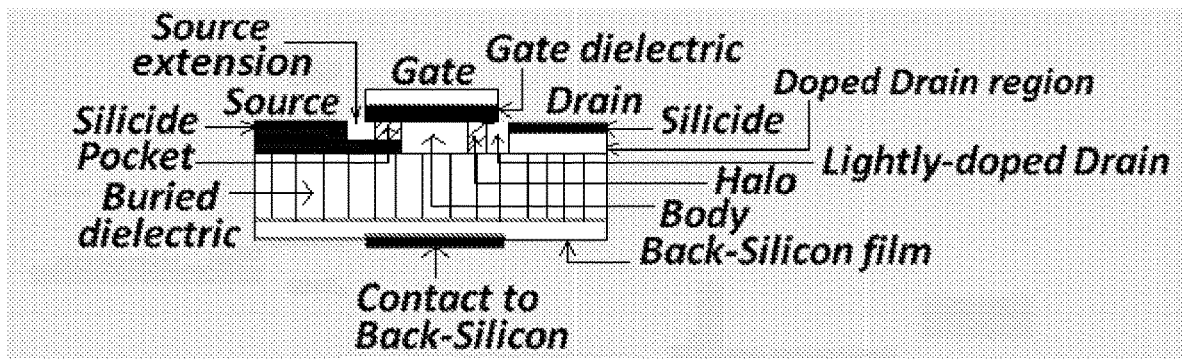
FIG. 1a: Cross-section Cartoons of a new structure for SOI MOSFET showing the High doped Pocket and its shunt to the Source-diffusion region with Silicide (back-Silicide). Pocket extends in Front-Silicon and only underneath the Gate, and the Silicide covers the entire lateral width of pocket.
Figure 1B:
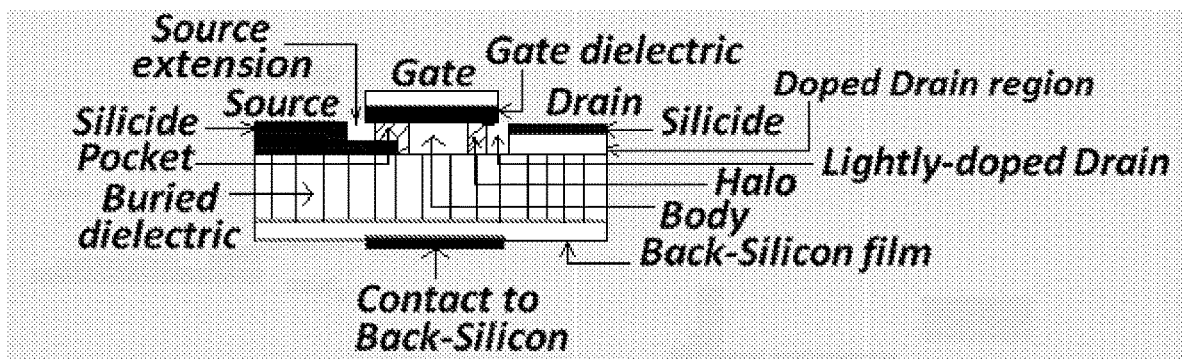
FIG. 1b: Cross-section Cartoons of a new structure for SOI MOSFET showing the High doped Pocket and its shunt to the Source-diffusion region with Silicide. Pocket extends in the Front-Silicon and only underneath the Gate, and the Silicide covers portion of the lateral width of Pocket.
Figure 2:
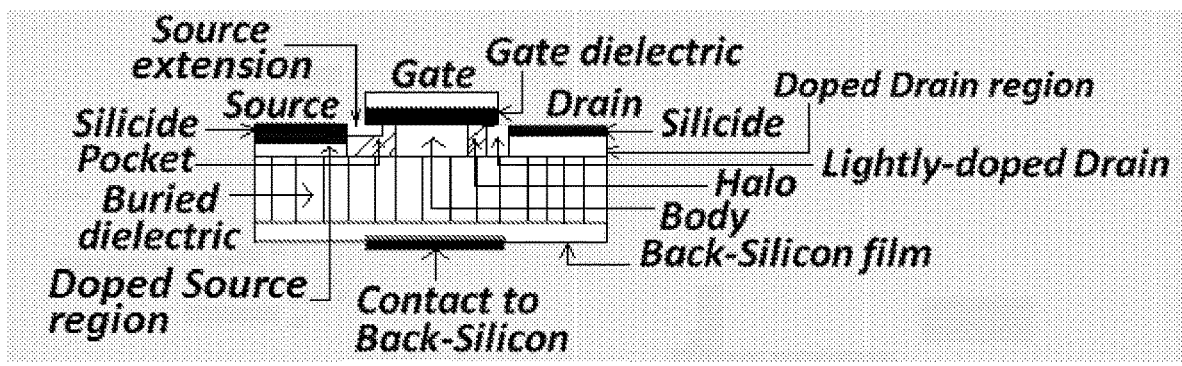
FIG. 2: Cross-section Cartoons of a new structure for SOI MOSFET showing the High doped Pocket and its shunt to the Source-diffusion region with Silicide. The pocket extends only partially underneath the Gate region while it extends further into the Source. The Silicide consumes little from the lateral width of pocket.
Figure 3:
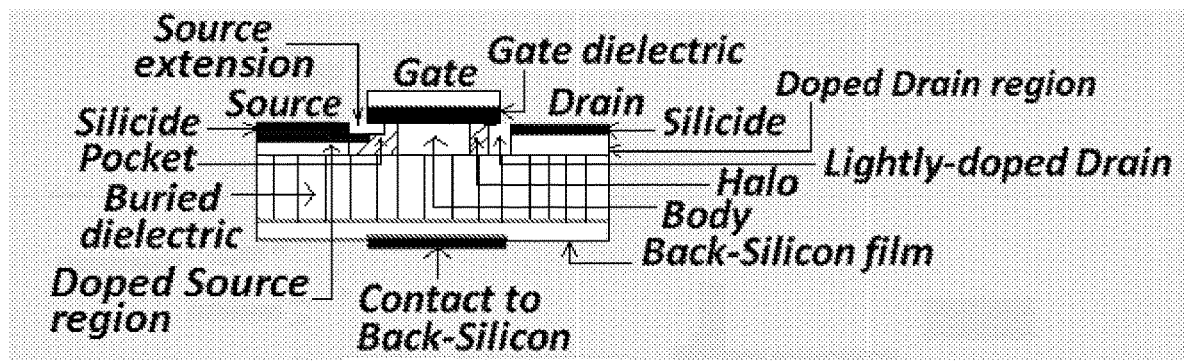
FIG. 3: Cross-section Cartoons of a new structure for SOI MOSFET showing the High doped Pocket and its shunt to the Source-diffusion region with Silicide. The pocket extends only partially underneath the Gate region while it extends further into the Source. The Silicide covers portion of the lateral width of pocket.

The new device architecture for SOI MOSFET traps the Impact-Ionizations current in a band-engineered highly doped Pocket and routes it to the Source-diffusion region through highly conductive Silicide formation (back-Silicide) that solders this Pocket to the Source through the back-side of the Front-Silicon film. This prevents the Impact-Ionizations current from diffusing through the lateral Body-to-Source barrier and lowering it further. This highly doped Pocket in the Front-Silicon film has same dopant type as in Device Body and can either lay in its entirety underneath the Gate region, or it may extend only partially underneath this Gate region while it extends further into the Source; in this latter embodiment, portion of this Pocket in Front-Silicon, including all what is not underneath the Gate region does not encompass the entire thickness of this Front-Silicon. This is to ensure the efficient conduction of the device channel current. The lightly-doped Drain region helps to suppress the injection of Hot-electrons while the purpose of the lightly-doped Source region ensures that most of Junction depletion occurs within it and not in highly doped Pocket. These lightly-doped regions may be omitted when possible for simpler fabrication process. The back-Silicide can either encompass the entire lateral width of Pocket or it can only partially cover it. It may also be Raised relative to the back-side of the Front-Silicon film. The FIG. 1a, FIG. 1b, FIG. 2, FIG. 3, and FIG. 4 illustrate all these possible different embodiments for this new device architecture. For the shorter Gate channels this Pocket typically lays in its entirety underneath the Gate region in the Front-Silicon to provide added effective control against short-channel effects.

Raised back-Silicide designs relative to the back-side of the Front-Silicon film become essential when this Front-Silicon is ultra-thinned (~7 nm-25 nm). It prevents this Silicide in the highly doped pocket from deteriorating the Gate channel.

The process steps for the fabrication of this back-Silicide band-engineered design can start with the implantation of an etch-Stop-Layer (ESL) through the surface of a seed Wafer (that is the Wafer that is to be bounded to the Handle Wafer). This can be followed with the growth of thick epitaxy atop this seed Wafer surface. This epitaxy will then become the active Silicon film of the MOS device (which can be as ultra-thin as 7-35 nm) after processing it, depositing dielectric on top of it, and bounding it to the Handle Wafer. Another approach is not to use epitaxy; Carbon is implanted as ESL through the surface of seed Wafer. Carbon is electrically-inactive in Silicon and when implanted at temperatures close to 500 deg C. Crystal damage is lowered or minimized. Other electrically-inactive species (e. g. Nitrogen) can also be implanted instead of Carbon.

This surface of the seed Wafer is then processed after it is thoroughly cleaned—The formation of back-Silicide that wires the highly doped Pocket to Source can be accomplished through either one of two separate approaches:

1—The Body, Source and Drain diffusion regions are implanted first and the highly doped Pocked is formed (this can either be through patterning it and then implanting it, and/or through using angled implants on deposited Photo-resist). The surface is then polished with Chemical-Mechanical Polish (CMP), cleaned and the back-Silicide that solders this highly doped pocket to the Source is processed. Recess etch of the portion of Silicon that does not encompass this back-Silicide is then performed to ultra-thin the device body to its targeted thinness.

2—The center Body is implanted first. This is followed with growth of high quality Silicon or Silicon-Germanium Epitaxy atop both lateral side edges of the Silicon. This Epitaxy is then implanted to form the Drain, Source and Pocket regions over which the back-Silicide is formed next. (This epitaxy may also be grown to form the Source and Pocket regions only atop which the back-Silicide is formed while the Drain region lays exclusively in the bulk Silicon).

Figure 4:
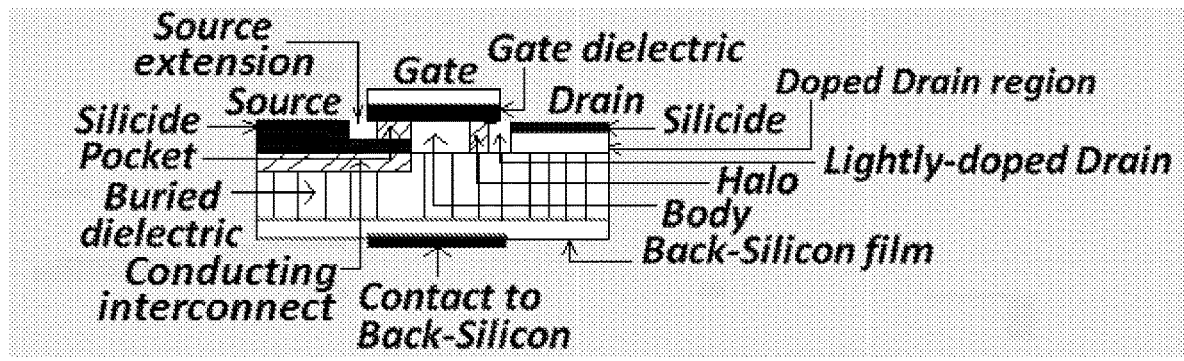
FIG. 4: A Cross-section Cartoon of a new structure for SOI MOSFET (that of FIG. 1a) showing the Metal Contact to the Silicide (back-Silicide). This Metal can also and similarly contact the Silicide in all the device structures of FIG. 1b, FIG. 2, and FIG. 3.

Trenched or rectangular metals (e. g. Tungsten) can also contact this Silicide that wires the highly doped Pocket to Source as the FIG. 4 shows. This metal can either contact the entire back-Silicide that wires the Source to Pocket (as in FIG. 4) or only portion of it.

Inline dielectric is finally deposited. This Inline dielectric can be thin enough just to enable an effective dielectric-to-dielectric bonding of this seed Wafer to the Handle wafer that typically have better dielectric quality on its surface (this can either be thermally grown Silicon-dioxide or any other dielectric). Tough refractory metals that can form Silicide stable at high temperatures (~900-1000 Deg C.) are used in the formation of this back-Silicide. This is because of the much high temperatures that are to follow throughout the continuation of this fabrication process. This back-Silicide must be stable and capable to withstand the upcoming heat cycles (e.g. the thermal growth of the Gate dielectric, Source/Drain Annealing, etc. . . . ). Examples can be: TiSi2(C54), TaSi2, MoSi2, WSi2, CoSi2. A technique that boosts the thermal stability of Nickel-Silicide at higher temperatures (~700-1000 Deg C.) may even allow the use of Nickel-Silicide to wire this highly doped pocket to the Source. This requires the deposition of thin Aluminum film (typically ~3-5 nm thick) onto the Silicon prior to depositing the Nickel and applying the required heat-cycles to form this Nickel-Silicide. This approach was described and demonstrated in the work of Takashi Shiozawa, "*Improvement of Thermal Stability of Ni Silicide on Heavily Doped N+—Si*", Iwai Laboratory, Department of Electronics and Applied Physics, pp. 41-59, 2007. Germanium Pre-amorphous Implant (GPI) can be implanted prior to depositing any metals for Silicide formation. This is to craft an amorphous layer into the Silicon region where the Source-diffusion and the highly doped Pocket are to be formed. This GPI proved to enable formation of better Silicide and prevents or suppresses any metallic pipes from diffusing deeper into the Silicon film and closer to the conducting device channel.

Because the deposited Inline dielectric into the surface of the seed Wafer can outgas and creates voids upon being subjected to high temperatures after bonding this seed Wafer to the surface dielectric of a Handle Wafer, this Silicided seed Wafer undergoes prior to this bonding a high temperature anneal that outgases any by-products or gas molecules that were absorbed during the deposition of this Inline dielectric. This pre-bond anneal is typically anywhere between 800 Deg C. and 1200 Deg C. but may be lower. CMP is followed next and the seed and Handle Wafers are then bonded together through their surface dielectrics. A post-bond anneal is then performed to strengthen this bond and the two Wafers become one Wafer.

The back-Silicon of the seed Wafer is then polished. Typically grinding is performed first to thin this back-Silicon down to 30-50 μm. This grinding can be highly time-efficient in the high-volume manufacturing due to its highest thinning rate. It is a two-step process that includes a coarse grinding (at ~5 μm/s) and a subsequent fine grinding (at ~1 μm/s). This second step is necessary to remove most of the damage layer created by the coarse grinding step and to reduce surface roughness. Additional thinning processes are performed next to further thin down this back-Silicon down to 100-200 nm prior to utilizing MagnetoRheological Finishing (MRF) and/or Plasma Chemical Vaporization Machining (PCVM) for the exact precise thinning of the Silicon film and for minimizing its surface roughness. These additional thinning processes prior to MRF and/or PCVM can include combinations of dry/wet etching and CMP in aim to substantially further reduce the thickness of this back Silicon. The purpose of the ESL is to impede the etch-rate from these dry/wet etch prior to the precision thinning with MRF and/or PCVM. The ESL layer can be also implanted instead through the back Silicon when this back-Silicon becomes sufficiently thinned, or it may even be omitted all together when a very precise control of the polish steps can be undertaken with precise use of MRF and/or PCVM).

Figure 5:
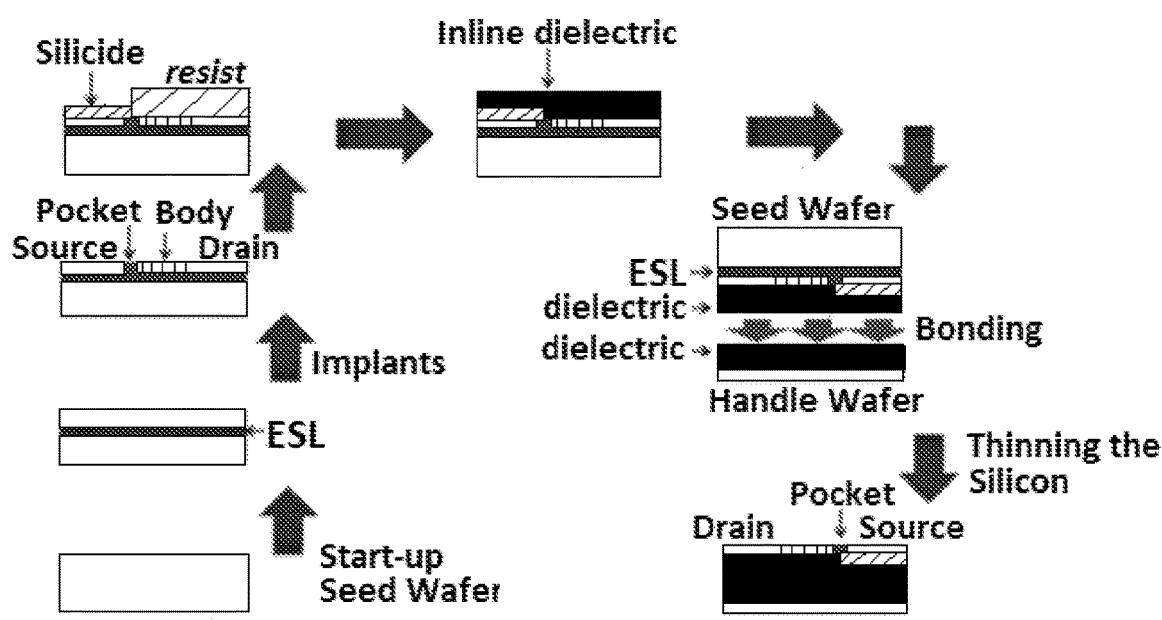
FIG. 5: A generalized figure summarizing the different steps that are required for the formation of the back-Silicide.

The FIG. 5 shows or illustrates the main processing steps that are involved in the fabrication of this back-Silicide.

After the Front-Silicon film is thinned to its targeted/desired thinness through following the steps described above, devices are then fabricated in following the processes that are same or similar to the today's standard processes for fabricating CMOS. The stronger and thermally-stable back-Silicide is capable to withstand the elevated 800-1100° C. temperatures that are typically required in the frontend process. The Gate dielectric can be thermally grown at temperatures lower than 700-900° C., and the Source-Drain-Annealing (SDAL) temperatures can be slightly lowered to below 900-1000° C.

What is claimed is:

1. A semiconductor electronic device comprising:
   a silicon-on-insulator (SOI) substrate comprising a buried dielectric layer on a back silicon substrate, and an active semiconductor layer on top of a the buried dielectric layer; and
   a metal-oxide-semiconductor field-effect transistor (MOSFET) wherein the MOSFET comprises:
   a gate electrode on a gate region of the active semiconductor layer;

an insulating dielectric film separating the gate electrode from the gate region of the active semiconductor layer;

two highly doped regions having a first conductivity type that form a drain and a source and extend laterally under the gate electrode in the active semiconductor layer from two opposing ends;

first and second silicide regions directly on the respective source and drain;

a highly doped HALO pocket having a second conductivity type opposite to the first conductivity type under the gate electrode in the active semiconductor layer adjacent to the drain;

a highly doped second pocket under the gate electrode in the active semiconductor layer and adjacent to the source having the second conductivity type and electrically shorted to the first silicide region, and a body region in the active semiconductor layer laterally between the HALO pocket and the second pocket having the second conductivity type with a doping level less than the HALO pocket or the second pocket.

2. The device of claim 1 wherein the buried dielectric layer comprises sapphire, aluminum nitride, diamond, silicon carbide or silicon dioxide.

3. The device of claim 1 wherein the second pocket has a substantially different size and shape than the HALO pocket.

4. The device of claim 1 wherein the second pocket is in direct contact with the first silicide region.

5. The device of claim 1, wherein an electrically conductive interconnect connects the first silicide to the second pocket.

* * * * *